United States Patent
Hatano et al.

(10) Patent No.: US 9,112,122 B2
(45) Date of Patent: Aug. 18, 2015

(54) LIGHT-EMITTING DEVICE AND METHOD FOR MANUFACTURING SAME

(75) Inventors: Takuji Hatano, Suita (JP); Hitoshi Adachi, Atsugi (JP); Takashi Washizu, Hino (JP); Yoshihito Taguchi, Hachioji (JP)

(73) Assignee: KONICA MINOLTA ADVANCED LAYERS, INC., Tokyo (JP)

( * ) Notice: Subject to any disclaimer, the term of this patent is extended or adjusted under 35 U.S.C. 154(b) by 251 days.

(21) Appl. No.: 13/641,404

(22) PCT Filed: Apr. 12, 2011

(86) PCT No.: PCT/JP2011/059056
§ 371 (c)(1),
(2), (4) Date: Oct. 15, 2012

(87) PCT Pub. No.: WO2011/129320
PCT Pub. Date: Oct. 20, 2011

(65) Prior Publication Data
US 2013/0037844 A1 Feb. 14, 2013

(30) Foreign Application Priority Data
Apr. 13, 2010 (JP) .................. 2010-091944

(51) Int. Cl.
| | | |
|---|---|---|
| *H01L 33/00* | (2010.01) |
| *C09K 11/08* | (2006.01) |
| *H01L 33/50* | (2010.01) |
| *C09K 11/77* | (2006.01) |
| *C04B 35/44* | (2006.01) |

(Continued)

(52) U.S. Cl.
CPC ............... *H01L 33/501* (2013.01); *B82Y 30/00* (2013.01); *C04B 35/44* (2013.01); *C04B 35/50* (2013.01); *C09K 11/7774* (2013.01); *C04B 2235/3224* (2013.01); *C04B 2235/3225* (2013.01); *C04B 2235/349* (2013.01); *C04B 2235/3418* (2013.01); *C04B 2235/483* (2013.01);

(Continued)

(58) Field of Classification Search
CPC .................... H01L 2933/0041; H01L 33/502; C04B 2235/9646
See application file for complete search history.

(56) References Cited

U.S. PATENT DOCUMENTS

| | | |
|---|---|---|
| 6,756,731 B1 | 6/2004 | Sano |
| 2002/0079837 A1 | 6/2002 | Okazaki |

(Continued)

FOREIGN PATENT DOCUMENTS

| | | |
|---|---|---|
| JP | 11-106685 | 4/1999 |
| JP | 11-251640 | 9/1999 |

(Continued)

OTHER PUBLICATIONS

Japanese Office Action, Notification of Grounds for Rejection, Patent Application No. 2012-510656, mailed on Sep. 24, 2014 and an English translation thereof (total of 7 pages).

*Primary Examiner* — Kimberly Rizkallah
*Assistant Examiner* — Mounir Amer
(74) *Attorney, Agent, or Firm* — Lucas & Mercanti, LLP (57) ABSTRACT

A light-emitting device (100) is provided with a metal part (2) atop a planar LED substrate (1), and an LED element (3) is disposed atop the metal part (2). A glass substrate (5) is provided to an upper surface of the LED element (3), and a wavelength conversion part (6) is formed on an upper surface of the glass substrate (5). The wavelength conversion part (6) comprises a light-transmissive ceramic layer formed by heating a mixture containing a phosphor, an organometallic compound, a layered silicate mineral, an inorganic particulate, an organic solvent, and water.

12 Claims, 3 Drawing Sheets

(51) Int. Cl.
*C04B 35/50* (2006.01)
*B82Y 30/00* (2011.01)

(52) U.S. Cl.
CPC .................. *C04B 2235/5436* (2013.01); *C04B 2235/5454* (2013.01); *C04B 2235/9646* (2013.01); *H01L 2933/0041* (2013.01)

(56) References Cited

U.S. PATENT DOCUMENTS

2002/0163302 A1 11/2002 Nitta et al.
2009/0015138 A1 1/2009 Daicho et al.
2009/0278147 A1* 11/2009 Suzuki ............................ 257/98
2010/0092407 A1* 4/2010 Kurata et al. .................. 424/53
2011/0215348 A1* 9/2011 Trottier et al. ................. 257/89

FOREIGN PATENT DOCUMENTS

| | | |
|---|---|---|
| JP | 2000-349340 | 12/2000 |
| JP | 2001-181614 | 7/2001 |
| JP | 2002-185046 | 6/2002 |
| JP | 2002-314142 | 10/2002 |
| JP | 2004-153109 | 5/2004 |
| JP | 2009-038348 | 2/2009 |
| JP | 2010-050236 | 3/2010 |

* cited by examiner

LIGHT-EMITTING DEVICE AND METHOD FOR MANUFACTURING SAME

RELATED APPLICATIONS

This is a U.S. National Phase Application under 35 USC 371 of International Application PCT/JP2011/059056 filed Apr. 12, 2011.

This application claims the priority of Japanese application no. 2010-091944 filed Apr. 13, 2010, the entire content of which is hereby incorporated by reference.

TECHNICAL FIELD

The present invention relates to a light-emitting device having a light-emitting element as well as a wavelength conversion part including a phosphor for converting the wavelength of light emitted from the light-emitting element.

BACKGROUND ART

In recent years there has been increasingly widespread use of a technique for obtaining white light-emitting diodes (LEDs) by arranging an yttrium aluminum garnet (YAG) phosphor or other type of phosphor in the vicinity of a gallium nitride (GaN)-based blue LED chip, and color-mixing the blue light emitted from the blue LED chip and yellow light emitted by secondary emission upon the phosphor receiving the blue light.

With a white LED of such description, there is generally employed a method for using a transparent resin throughout which the phosphor has been dispersed, to seal in an LED chip and/or a mounting part. However, the specific gravity of the phosphor is greater than that of the transparent resin, and accordingly there is settling of the phosphor before the resin has cured, which causes color unevenness during light emission, among other problems.

In view whereof, there have been a variety of proposed methods for suppressing the settling of the phosphor to prevent the occurrence of color unevenness. For example, as recited in Patent Citation 1, a silicone resin having a viscosity of 100 to 10,000 cP during resin curing is used as a sealing body to suppress settling and/or segregation of the phosphor. Patent Citation 2 discloses a chip component-type LED in which an LED element is disposed between an upper end opening and a lower end opening of a cylindrical container, which is filled with a light-transmissive resin from the upper end opening to the lower end opening, and an inner wall surface of the container is formed such that emitted light from the LED element is reflected toward the upper end opening.

Patent Citation 3 discloses a light-emitting device, as well as a method for producing same, in which a lipophilic compound made by adding organic cations to a layered compound primarily composed of a clay mineral is added to a liquid light-transmissive sealing material, as an anti-settling agent for the phosphor. Patent Citation 4 discloses a semiconductor light-emitting device in which a glass material or a glass material composed of a ceramic precursor polymer is used as a light-transmissive sealing material.

LIST OF CITATIONS

Patent Literature

Patent Citation 1: Japanese Laid-open Patent Publication 2002-314142

Patent Citation 2: Japanese Laid-open Patent Publication 2002-185046

Patent Citation 3: Japanese Laid-open Patent Publication 2004-153109

Patent Citation 4: Japanese Laid-open Patent Publication 11-251604

SUMMARY OF INVENTION

Technical Problem

However, in Patent Citation 1, because the LED chip is sealed with a silicone resin, coloration of the sealing material and other forms of degradation are more prone to proceed due to light emission from the LED chip and/or heat emission from the LED chip and the phosphor. For this reason, it has been difficult to obtain the durability needed to withstand long-term use. Further, with the configuration in Patent Citation 2, a problem also emerges in that the configuration of the LED is complicated, leading to an increase in cost. Patent Citations 2 and 3 also disclose an epoxy resin, a silicone resin, a polyimide resin, and other resin materials as specific examples of a light-transmissive sealing material, and, similarly with respect to Patent Citation 1, have not been sufficient in terms of the durability of the sealing material.

In view whereof, in Patent Citation 4, a sealing material which turns into a ceramic after being heated is used to seal in the LED chip and thereby improve the heat resistance and light resistance of the LED chip. In such a case, when the layered compound recited in Patent Citation 3 is added as an anti-settling agent for the phosphor, the dispersion state of the phosphor is stabilized and there is the possibility of reducing the occurrence of color unevenness. However, with the mere addition of the layered compound, the mixture of the sealing material and the anti-settling agent has a low viscosity, resulting in settling of the phosphor before the sealing material has cured, and the efficiency in suppressing settling has not been sufficient. The film strength after curing has also not been sufficient.

The present invention has been contrived in view of the foregoing circumstances, it being an objective thereof to provide a light-emitting device provided with a wavelength conversion part in which a phosphor has been evenly dispersed within a highly heat-resistant light-transmissive member, whereby the occurrence of color unevenness is reduced and whereby the light-emitting device is endowed with superior durability; an objective thereof is also to provide a method for producing the light-emitting device.

Solution to Problem

In order to achieve the foregoing objectives, the present invention is a light-emitting device having a light-emitting element for emitting light of a predetermined wavelength as well as a wavelength conversion part containing a phosphor, the phosphor being excited by light emitted from the light-emitting element and giving off fluorescent light of a wavelength different from an excitation wavelength, the wavelength conversion part having a light-transmissive ceramic layer containing the phosphor, a layered silicate mineral, and an inorganic particulate, and the phosphor being substantially evenly dispersed within the ceramic layer.

In another aspect of the light-emitting device according to the present invention, the layered silicate mineral content of the ceramic layer is 0.5 to 20 wt %.

In another aspect of the light-emitting device according to the present invention, the layered silicate mineral content of the ceramic layer is 0.5 to 10 wt %.

In another aspect of the light-emitting device according to the present invention, the inorganic particulate content of the ceramic layer is 0.5 to 50 wt %.

In another aspect of the light-emitting device according to the present invention, the inorganic particulate content of the ceramic layer is 0.5 to 20 wt %.

In another aspect of the light-emitting device according to the present invention, the layered silicate mineral content of the ceramic layer is 0.5 to 20 wt % and the inorganic particulate content is 0.5 to 50 wt %.

In another aspect of the light-emitting device according to the present invention, the layered silicate mineral is a swellable clay mineral.

In another aspect of the light-emitting device according to the present invention, the swellable clay mineral having a smectite structure.

In another aspect of the light-emitting device according to the present invention, the mean particle diameter of the phosphor is 1 to 50 μm.

In another aspect of the light-emitting device according to the present invention, the organometallic compound is an organosiloxane compound.

In another aspect of the light-emitting device according to the present invention, a mean particle diameter of a primary particle diameter of the inorganic particulate is 0.001 to 50 μm.

In another aspect of the light-emitting device according to the present invention, a thickness of the ceramic layer is 5 to 500 μm.

In another aspect of the light-emitting device according to the present invention, the wavelength conversion part is formed atop a substrate comprising a transparent inorganic material, and the substrate having the wavelength conversion part is disposed on a light-emitting-surface-side of the light-emitting element.

In another aspect of the light-emitting device according to the present invention, the light-emitting element is sealed in using the ceramic layer.

The present invention further relates to a method for producing a light-emitting device, the method having: a step for preparing a mixture containing a phosphor, an organometallic compound, a layered silicate mineral, an inorganic particulate, an organic solvent, and water; a step for applying the mixture on a substrate comprising a transparent inorganic material, and applying heat to manufacture a wavelength conversion part; and a step for disposing the wavelength conversion part on a light-emitting-surface-side of a light-emitting element.

The present invention further relates to a method for producing a light-emitting device, the method comprising: a step for preparing a mixture containing a phosphor, an organometallic compound, a layered silicate mineral, an inorganic particulate, an organic solvent, and water; and a step for adding the mixture in a dropwise manner onto a light-emitting element and applying heat to manufacture a wavelength conversion part for sealing in the light-emitting element.

In another aspect of the method for producing a light-emitting device according to the present invention, the ratio of the organometallic compound to the organic solvent in the mixture is 5 to 50 wt %, and the ratio of water relative to the total amount of solvent when both the organic solvent and the water are added is 5 to 50 wt %.

In another aspect of the method for producing a light-emitting device according to the present invention, the water and the layered silicate mineral, which is hydrophilic and has not been surface-treated, are mixed together, whereupon the phosphor, the inorganic particulate, the organometallic compound, and the organic solvent are mixed to prepare the mixture.

In another aspect of the method for producing a light-emitting device according to the present invention, the organometallic compound, the organic solvent, and the layered silicate mineral, which is lipophilic and has been surface-treated, are mixed together, whereupon the phosphor, the inorganic particulate, and the water are mixed to prepare the mixture.

In another aspect of the method for producing a light-emitting device according to the present invention, the heating temperature of the mixture is 100 to 1,000° C.

In another aspect of the method for producing a light-emitting device according to the present invention, the viscosity of the mixture is 25 to 800 cP.

The present invention further relates to a mixture for forming a wavelength conversion part containing a phosphor, the phosphor being excited by light emitted from a light-emitting element and giving off fluorescent light of a wavelength different from an excitation wavelength, and the mixture containing the phosphor, an organometallic compound, a layered silicate mineral, an inorganic particulate, an organic solvent, and water.

In another aspect of the mixture according to the present invention, the ratio of the water relative to the total amount of the organic solvent and the water is 5.0 to 60 wt %.

In another aspect of the mixture according to the present invention, the layered silicate mineral content is 0.5 to 3 wt %, and the ratio of the water relative to the total amount of the organic solvent and the water is 2 to 25 wt %.

Advantageous Effects of the Invention

According to a first aspect of the present invention, because the wavelength conversion part is formed of the light-transmissive ceramic layer, heating of the light-emitting element and the phosphor will not cause coloring or the like, nor will other factors, and long-term use becomes possible. Further, because a thickening effect imparted by the layered silicate mineral and the inorganic particulate will suppress settling of the phosphor within the mixture forming the ceramic layer, the phosphor can be dispersed in the ceramic layer in a substantially uniform manner, and the occurrence of color unevenness in the light-emitting device can be effectively suppressed. Also, because the ceramic layer contains the layered silicate mineral and the inorganic particulate, the strength of the ceramic layer is also improved.

In a second aspect of the present invention, which comprises the light-emitting device of the first aspect as mentioned above, a layered silicate mineral content of the ceramic layer of 0.5 to 20 wt % makes it possible to adequately increase the viscosity of the mixture prior to heating and to suppress settling of the phosphor.

In a third aspect of the present invention, which comprises the light-emitting device of the second aspect as mentioned above, a layered silicate mineral content of the ceramic layer of 0.5 to 10 wt % makes it possible to suppress a decline in the strength of the ceramic layer while also adequately increasing the viscosity of the mixture prior to heating and suppressing settling of the phosphor.

In a fourth aspect of the present invention, which comprises the light-emitting device of the first aspect as mentioned above, an inorganic particulate content of the ceramic layer of 0.5 to 50 wt % makes it possible maintain the strength of the ceramic layer after heating.

In a fifth aspect of the present invention, which comprises the light-emitting device of the fourth aspect as mentioned above, an inorganic particulate content of the ceramic layer of 0.5 to 20 wt % makes it possible to more effectively maintain the strength of the ceramic layer after heating.

In a sixth aspect of the present invention, which comprises the light-emitting device of the first aspect as mentioned above, a layered silicate mineral content of the ceramic layer of 0.5 to 20 wt % and an inorganic particulate content of 0.5 to 50 wt % makes it possible to adequately increase the viscosity of the mixture prior to heating and to suppress settling of the phosphor, and also makes it possible to maintain the strength of the ceramic layer after heating.

In a seventh aspect of the present invention, which comprises the light-emitting device of any of the first through sixth aspects as mentioned above, using a swellable clay mineral as the layered silicate mineral makes it possible for the viscosity of the mixture used in the formation of the ceramic layer to be increased, due to the swellable clay mineral being swollen by water.

In an eighth aspect of the present invention, which comprises the light-emitting device of the seventh aspect as mentioned above, using a swellable clay mineral having a smectite structure makes it possible to adopt a card-house structure in which water has entered between the layers of the smectite structure and caused same to swell, and therefore the viscosity of the mixture used in the formation of the ceramic layer can be considerably increased.

In a ninth aspect of the present invention, which comprises the light-emitting device of any of the first through sixth aspects as mentioned above, having the mean particle diameter of the phosphor be 1 to 50 µm makes it possible to minimize the gap created in the interface with the organometallic compound and to enhance the strength of the ceramic layer, while also maintaining light emission efficiency.

In a tenth aspect of the present invention, which comprises the light-emitting device of any of the first through sixth aspects as mentioned above, using an organosiloxane compound as the organometallic compound facilitates the formation of the ceramic layer, increases the viscosity of the mixture, and also improves the stability of the ceramic layer thus formed.

In an eleventh aspect of the present invention, which comprises the light-emitting device of any of the first through sixth aspects as mentioned above, having the mean particle diameter of the primary particle diameter of the inorganic particulate be 0.001 to 50 µm makes it possible to satisfactorily achieve a filling effect for packing in the gap created at the interface where the organometallic compound meets the phosphor and the layered silicate mineral, a thickening effect for increasing the viscosity of the mixture, and a film reinforcing effect for improving the film strength of the ceramic layer after heating.

In a twelfth aspect of the present invention, which comprises the light-emitting device of any of the first through sixth aspects as mentioned above, having the thickness of the ceramic layer be 5 to 500 µm makes it possible to prevent the occurrence of cracks or the like due to a decline in film strength while also maintaining adequate wavelength conversion efficiency.

In a thirteenth aspect of the present invention, which comprises the light-emitting device of any of the first through sixth aspects as mentioned above, coating the substrate composed of the transparent inorganic material with the mixture containing the phosphor, the organometallic compound, the layered silicate mineral, the inorganic particulate, the organic solvent, and water and applying heat to form the wavelength conversion part, and disposing the substrate on which the wavelength conversion part has been formed on the light-emitting surface side of the light-emitting element makes it possible to suppress the occurrence of color unevenness with a simple configuration, thus endowing the light-emitting device with superior durability with respect to the wavelength conversion part.

In a fourteenth aspect of the present invention, which comprises the light-emitting device of any of the first through sixth aspects as mentioned above, adding, in a dropwise manner onto the light-emitting element, the mixture containing the phosphor, the organometallic compound, the layered silicate mineral, the inorganic particulate, the organic solvent, and water, and applying heat to seal in the light-emitting element in the ceramic layer makes it possible to suppress the occurrence of color unevenness with a simple configuration, thus endowing the light-emitting device with superior durability with respect to the wavelength conversion part. In addition, because a substrate on which to form the wavelength conversion part is not required, the structure of the light-emitting device is simpler, and the number of components and the production steps can also be reduced. Because not only the upper surface of the light-emitting element but also the side surface thereof is sealed in by the wavelength conversion part, and because the light emitted from the side surface of the light-emitting element is also efficiently converted to fluorescent light, the occurrence of color unevenness can be even more effectively suppressed.

In a fifteenth aspect of the present invention, having the mixture, which is turned into the ceramic layer by heating, contain the phosphor, the organometallic compound, the layered silicate mineral, the inorganic particulate, the organic solvent, and water increases the viscosity of the mixture and suppresses settling of the phosphor within the mixture; therefore the occurrence of color unevenness can be suppressed and a light-emitting device having superior durability with respect to the wavelength conversion part can be easily produced.

In a sixteenth aspect of the present invention, having the mixture, which is turned into the ceramic layer by heating, contain the phosphor, the organometallic compound, the layered silicate mineral, the inorganic particulate, the organic solvent, and water increases the viscosity of the mixture and suppresses settling of the phosphor within the mixture; therefore, the occurrence of color unevenness can be suppressed and a light-emitting device having superior durability with respect to the wavelength conversion part can be easily produced. Further, the light-emitting element can be sealed in while simultaneously the wavelength conversion part is being formed, and the steps for producing the light-emitting device can be further simplified.

In a seventeenth aspect of the present invention, which comprises the method for producing a light-emitting device as in the fifteenth or sixteenth aspect as mentioned above, having the ratio of the organometallic compound relative to the organic solvent within the mixture be 5 to 50 wt % and having the ratio of water relative to the total amount of solvent when the water has been added to the organic solvent be 5 to 50 wt % makes it possible to increase the viscosity of the mixture and suppress any settling of the phosphor, as well as to maintain the strength of the ceramic layer after heating.

In an eighteenth aspect of the present invention, which comprises the method for producing a light-emitting device as in the fifteenth or sixteenth aspect as mentioned above, in which case a layered silicate mineral which is hydrophilic and has not been surface-treated is used, first pre-mixing the layered silicate mineral and the water together and thereafter mixing the phosphor, the inorganic particulate, the organometallic compound, and the organic solvent to prepare the mixture makes it possible to evenly mix in the hydrophilic layered silicate mineral and to further enhance the thickening effect.

In a nineteenth aspect of the present invention, which comprises the method for producing a light-emitting device as in the fifteenth or sixteenth aspect as mentioned above, in which case a layered silicate mineral which is lipophilic and has not been surface-treated is used, first pre-mixing the layered silicate mineral, the organometallic compound, and the organic solvent together and thereafter mixing the phosphor, the inorganic particulate, and the water to prepare the mixture makes it possible to evenly mix in the lipophilic layered silicate mineral and to further enhance the thickening effect.

In a twentieth aspect of the present invention, which comprises the method for producing a light-emitting device as in the fifteenth or sixteenth aspect as mentioned above, heating the mixture to 100 to 1,000° C. to form the ceramic layer makes it possible to prevent the layered structure from breaking due to thermal decomposition of the layered silicate mineral, while allowing the polymerization reaction to proceed smoothly.

In a twenty-first aspect of the present invention, which comprises the method for producing a light-emitting device as in the fifteenth or sixteenth aspect as mentioned above, having the viscosity of the mixture be 25 to 800 cP makes it possible to improve the dispersibility of the phosphor within the ceramic layer after heating.

In a twenty-second aspect of the present invention, having the mixture for forming the wavelength conversion part contain the phosphor, the organometallic compound, the layered silicate mineral, the inorganic particulate, the organic solvent, and water suppresses the occurrence of color unevenness, thus causing the mixture to be particularly suitable for producing a light-emitting device also having superior durability in terms of the wavelength conversion part.

In a twenty-third aspect of the present invention, which comprises the mixture as in the twenty-second aspect as mentioned above, having the ratio of water relative to the total amount of the organic solvent and the water be 5.0 to 60 wt % makes it possible to adequately obtain a thickening effect imparted by the swelling of the layered silicate mineral.

In a twenty-fourth aspect of the present invention, which comprises the mixture as in the twenty-second aspect as mentioned above, having the layered silicate mineral content be 0.5 to 3 wt % and having the ratio of the water relative to the total amount of the organic solvent and the water be 2 to 25 wt % makes it possible to reach suitable ranges for the thickening effect imparted by the swelling of the layered silicate mineral as well as for the strength of the ceramic layer after heating.

DESCRIPTION OF EMBODIMENTS

Figure 1:
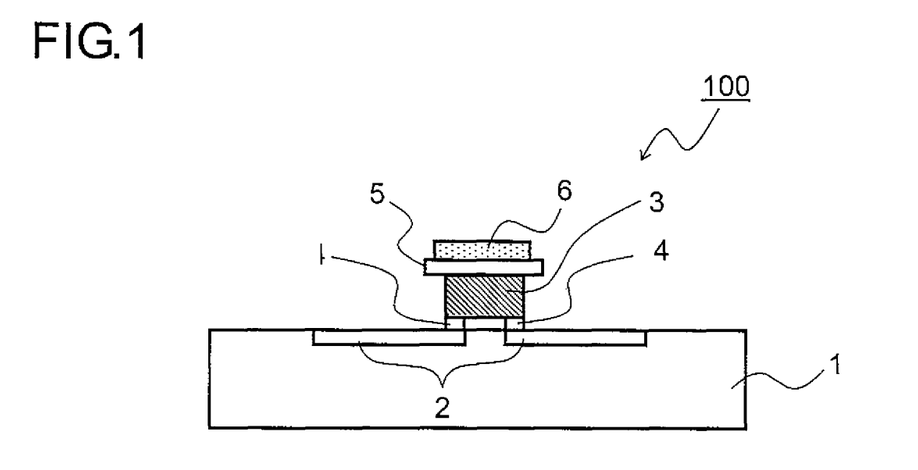
FIG. 1 is a schematic cross-sectional view of a light-emitting device according to a first embodiment of the present invention.

Provided below is a description of embodiments of the light-emitting device according to the present invention, with reference to the accompanying drawings. FIG. 1 is a schematic cross-sectional view of a light-emitting device according to a first embodiment of the present invention. As illustrated in FIG. 1, a light-emitting device 100 is provided with a metal part 2 atop a planar LED substrate 1, and an LED element 3 is disposed atop the metal part 2. The LED element 3 is provided with a protruding electrode 4 on a surface facing the metal part 2, and the metal part 2 and the LED element 3 are connected via the protruding electrode 4 (flip-chip configuration).

In the present embodiment, a blue LED element is used as the LED element 3. The blue LED element has a multi-layered structure comprising, for example, an n-GaN-based cladding layer, an InGaN light-emitting layer, a p-GaN-based cladding layer, and a transparent electrode, atop a sapphire substrate.

A glass substrate 5 is provided to an upper surface of the LED element 3, and a wavelength conversion part 6 is formed on an upper surface of the glass substrate 5. The wavelength conversion part 6 is a portion for converting light of a predetermined wavelength emitted from the LED element 3, into light of a different wavelength. A phosphor which is excited by the wavelength from the LED element 3 and gives off fluorescent light of a different wavelength than the excitation wavelength is added to the wavelength conversion part 6, within a light-transmissive ceramic layer.

The configuration of the wavelength conversion part 6 used in the light-emitting device of the present invention, as well as a method for forming the same, shall now be described. A transparent ceramic layer (glass body) of the wavelength conversion part 6, which is formed by a "sol-gel method" in which a sol-like mixture made by mixing an organometallic compound into an organic solvent is brought into a gel state by heating and then sintered, contains the phosphor as well as a layered silicate mineral and an inorganic particulate.

—Organometallic Compound—

The role of the organometallic compound is to serve as a binder for sealing the phosphor, the layered silicate mineral, and the inorganic particulate. Examples of the organometallic compound used in the present invention include a metallic alkoxide, a metallic acetylacetonate, a metallic carboxylate, and the like. A metallic alkoxide, being readily turned into a gel by hydrolysis and a polymerization reaction, is particularly preferable.

The metallic alkoxide may be a monomer, such as tetraethoxysilane, or may be a polysiloxane having a series of organosiloxane compounds in a chain- or ring-shaped configuration. A polysiloxane, whereby the viscosity of a mixture is increased, is particularly preferable. There is no limitation to the type of metal, provided that a light-transmissive glass body can be formed, but in terms of the stability and ease of production of the glass body thus formed, it is preferable that silicon be contained therein. The metallic alkoxide may also contain a plurality of different types of metals.

When the organometallic compound content of the ceramic layer is less than 2 wt %, there is too little of the organometallic compound serving as the binder, and the strength of the ceramic layer declines following heating and sintering. On the other hand, when the organometallic compound content is greater than 50 wt %, there is a corresponding decline in the layered silicate mineral content, and therefore the viscosity of the mixture prior to heating declines and the phosphor is prone to settling. Further, because there is also a corresponding decline in the inorganic particulate content, the strength of the ceramic layer also declines. For this reason, the organometallic compound content of the ceramic layer is preferably 2 to 50 wt %, more preferably 2.5 to 30 wt %.

—Phosphor—

The phosphor is excited by a wavelength of emitted light from the LED element 3 (an excitation wavelength), and emits fluorescent light of a different wavelength than the excitation wavelength. In the present embodiment, a YAG (yttrium-aluminum-garnet) phosphor for converting blue light (having a wavelength of 420 to 485 nm) emitted from the blue LED element into yellow light (having a wavelength of 550 to 650 nm) is used.

With the phosphor of such description, an oxide of yttrium, gadolinium, cerium, samarium, aluminum, lanthanum, or gallium, or a compound which readily turns into the oxide at a high temperature, is used, and is thoroughly mixed in at a stoichiometric ratio to obtain a raw mixed material. Alternatively, the raw mixed material is obtained by mixing aluminum oxide and gallium oxide together with a co-precipitated oxide obtained by dissolving the rare earth elements yttrium, gadolinium, cerium, and samarium in an acid at a stoichiometric ratio and sintering the co-precipitate obtained from co-precipitating the resulting solution in oxalic acid. An appropriate amount of ammonium fluoride or another fluoride is mixed into the resulting raw mixed material as a flux and pressure is applied to obtain a molded body. The resulting molded body is packed into a crucible and sintered in air for 2 to 5 hours in a temperature range of 1,350 to 1,450° C. to obtain a sintered body having the light-emitting properties of a phosphor.

Although a YAG phosphor is used in the present embodiment, the type of phosphor is not limited thereto; it is also possible to use, for example, a non-garnet-based phosphor not containing any cerium, or another similar type of phosphor. An increase in the particle diameter of the phosphor corresponds to an increase in the light-emitting efficiency (the wavelength conversion efficiency), but also conversely to an increase in the gap created in the interface with the organometallic compound as well as to a decline in the film strength of the ceramic layer thus formed. As such, the light-emitting efficiency and also the size of the gap created in the interface with the organometallic compound being taken into consideration, the mean particle diameter is preferably 1-50 µm. The mean particle diameter of the phosphor can be measured by, for example, a Coulter counter method.

—Layered Silicate Mineral—

Preferably, the layered silicate mineral is a swellable clay mineral having a mica structure, a kaolinite structure, a smectite structure, or another similar structure. A smectite structure, which has high swellability, is particularly preferable. This is because, as shall be described below, adding water to the mixture causes water to enter in between the layers of the smectite structure, which thus adopts a swelled card-house structure, and therefore there is an effect whereby the viscosity of the mixture used to form the ceramic layer is considerably increased. Further, because the shape of the layered silicate mineral within the ceramic layer is planar, the film strength of the ceramic layer can be improved.

When the layered silicate mineral content of the ceramic layer is less than 0.5 wt %, the effect whereby the viscosity of the mixture used to form the ceramic layer is increased is not adequately obtained. On the other hand, when the layered silicate mineral content is greater than 20 wt %, there is a decline in the strength of the ceramic layer after heating. As such, the layered silicate mineral content is preferably 0.5 to 20 wt %, more preferably 0.5 to 10 wt %.

Also, the compatibility with the organic solvent being taken into consideration, it is also possible to use, where appropriate, a layered silicate mineral the surface of which has been modified (surface-treated) with an ammonium salt or the like.

—Inorganic Particulate—

The inorganic particulate has a filling effect for packing in the gap created at the interfaces where the organometallic compound meets the phosphor and the layered silicate mineral, a thickening effect for increasing the viscosity of the mixture before heating, and a film reinforcing effect for improving the film strength of the ceramic layer after heating. Examples of the inorganic particulate used in the present invention include silicon oxide, titanium oxide, zinc oxide, and other oxide particulates, as well as magnesium fluoride and other fluoride particulates. In particular in a case where a polysiloxane or other silicon-containing organic compound is used as the organometallic compound, it is preferable to use a particulate of silicon oxide, from the standpoint of the stability of the ceramic layer thus formed.

When the inorganic particulate content of the ceramic layer is less than 0.5 wt %, none of the aforedescribed effects is adequately obtained. On the other hand, when the inorganic particulate content is greater than 50 wt %, there is a decline in the strength of the ceramic layer after heating. As such, the inorganic particulate content of the ceramic layer is 0.5 to 50 wt %. A range of 0.5 to 40 wt % is preferable, and a range of 0.5 to 20 wt % is more preferable. Each of the aforedescribed effects being taken into consideration, the mean particle diameter of the inorganic particulate is preferably 0.001 to 50 µm, more preferably 0.005 to 20 µm. The mean particle diameter of the inorganic particulate can be measured by, for example, a Coulter counter method.

The compatibility with the organometallic compound and/or organic solvent being taken into consideration, it is also possible to use, where appropriate, an inorganic particulate the surface of which has been treated with a silane coupling agent and/or a titanium coupling agent.

—Precursor Solution—

The precursor solution refers to when the organometallic compound has been mixed into the organic solvent; the precursor solution can be heated to obtain a light-transmissive ceramic layer. The wavelength conversion part 6 is formed by mixing the phosphor, the layered silicate mineral, and the inorganic particulate into the precursor solution and heating the resulting mixture. Adding water to the mixture allows the water to be brought in between the layers of the layered silicate mineral and increases the viscosity of the mixture, and therefore any settling of the phosphor can be suppressed. A concern is presented in that the polymerization reaction may be impeded when impurities are included in the water, and therefore it is a requirement that the water to be added be pure water not including any impurities.

Preferably, the organic solvent is methanol, ethanol, propanol, butanol, or any other alcohol having superior compatibility with the water being added. When the mixed amount of the organometallic compound relative to the organic solvent is less than 5 wt %, it becomes difficult to increase the viscosity of the mixture, and when the mixed amount of the organometallic compound is greater than 50 wt %, the result is that the polymerization reaction proceeds faster than is necessary. For this reason, the mixed amount of the organometallic compound relative to the organic solvent is preferably 5 to 50 wt %, more preferably 8 to 40 wt %.

In a case where a lipophilic layered silicate mineral that has been surface-treated is used, one example of a procedure for preparing the mixture is to first pre-mix the layered silicate mineral into a solution obtained by mixing the organometallic compound into the organic solvent (the precursor solution), and thereafter to mix in the phosphor, the inorganic particulate, and the water. In a case where a hydrophilic layered silicate mineral that has not been surface-treated is used, the layered silicate mineral and the water are first pre-mixed together, and thereafter the phosphor, the inorganic particulate, and the precursor solution are mixed in. This makes it possible to evenly mix in the layered silicate mineral and further enhance the thickening effect. A preferable viscosity of the mixture is 25 to 800 cP; the most preferable viscosity is 30 to 500 cP.

When the ratio of water relative to the total amount of solvent when the water has been added to the organic solvent is less than 5 wt %, the aforementioned thickening effect cannot be adequately obtained. On the other hand, when the ratio of water is greater than 60 wt %, the effect of the excessive mixing of water in causing a decline in viscosity is greater than the thickening effect. For this reason, the ratio of water relative to the total amount of solvent is preferably 5 to 60 wt %, more preferably 7 to 55 wt %.

In the most preferred composition of the mixture, polysiloxane is used as the organometallic compound, and the most preferred compositional ranges of each of the components included in the mixture are 35 to 65 wt % polysiloxane dispersion, 0.1 to 5 wt % layered silicate mineral, 1 to 40 wt % inorganic particulate, and 2 to 50 wt % water. Preferably, the layered silicate mineral has a smectite structure, which has a high affinity for polysiloxane.

The glass substrate 5 is coated with a predetermined amount of the mixture obtained in the manner described above, and heated and sintered to form the wavelength conversion part 6 having a predetermined film thickness. The method for coating of the mixture is not particularly limited; a variety of known conventional methods can be used, including a bar coating method, a spin coating method, and a spray coating method. The polymerization reaction of the organometallic compound does not proceed in a case where the heating temperature is less than 100° C. On the other hand, in a case where the heating temperature is greater than 1,000° C., the result is that the layered silicate mineral will decompose and the layered structure will be destroyed. As such, the heating temperature for the mixture must be 100 to 1,000° C., preferably 250 to 600° C.

In a case where the thickness of the wavelength conversion part 6 thus formed is less than 5 μm, there is a decline in the wavelength conversion efficiency and sufficient fluorescent light is not obtained. On the other hand, when the thickness of the wavelength conversion part 6 is greater than 500 μm, there is a decline in the film strength and cracks or the like are more prone to occur. As such, the thickness of the wavelength conversion part 6 is preferably 5 to 500 μm.

Disposing the glass substrate 5, on which the wavelength conversion part 6 has been formed, atop the LED element 3 makes it possible to produce the light-emitting device 100. At such a time, when the particle diameters of the phosphor and the inorganic particulate included in the wavelength conversion part 6 are greater than the film thickness of the wavelength conversion part 6 (the ceramic layer) thus formed, the result is that some of the phosphor or inorganic particulate will project out from the surface of the wavelength conversion part 6, and the smoothness of the surface of the wavelength conversion part 6 will be lost. For this reason, the maximum particle diameters of the phosphor and the inorganic particulate used herein are less than the film thickness of the ceramic layer.

Because the light-emitting device 100 having been produced in this manner has the wavelength conversion part 6 formed of the light-transmissive ceramic layer, the heat resistance and/or light resistance can be improved compared to a case where the wavelength conversion part 6 is formed of a resin material. Further, because the phosphor is less prone to settling when the wavelength conversion part 6 is formed and because the phosphor is evenly dispersed within the wavelength conversion part 6, the occurrence of color unevenness can be effectively reduced. Further, the addition of the layered silicate mineral and the inorganic particulate also improves the film strength of the wavelength conversion part 6.

Although the planar glass substrate 5 is used in the embodiment described above, there is no particular limitation to the shape of the glass substrate 5, and, for example, a lens-shaped glass substrate 5 may also be used. There is also no limitation to the substrate being made of glass; for example, a sapphire substrate or other similar crystal substrate may also be used, provided that the substrate is composed of a transparent inorganic material.

Figure 2:
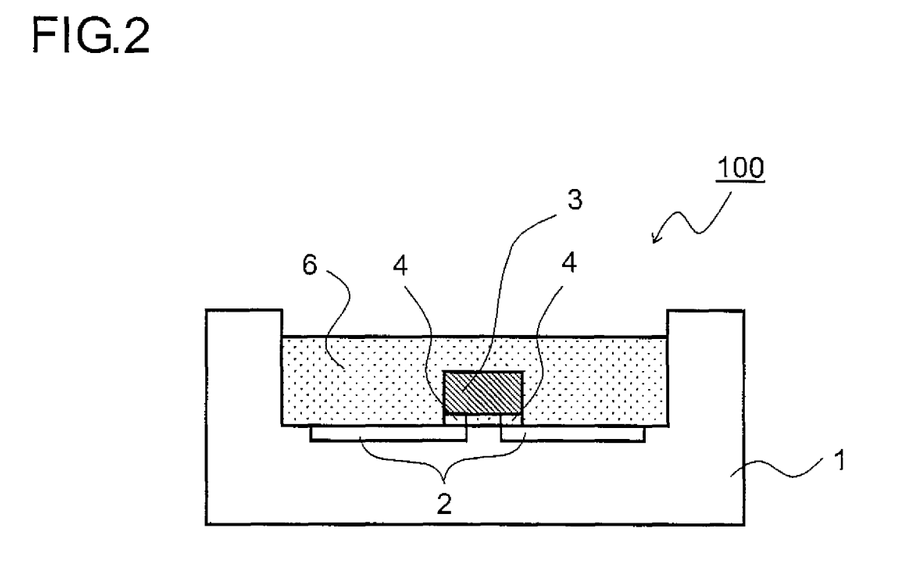
FIG. 2 is a schematic cross-sectional view of a light-emitting device according to a second embodiment of the present invention.

FIG. 2 is a schematic cross-sectional view of a light-emitting device according to a second embodiment of the present invention. As illustrated in FIG. 2, the light-emitting device 100 has the metal part 2 provided to a base part of the LED substrate 1, the cross-section of which is concave-shaped, and the LED element 3 is disposed atop the metal part 2. The wavelength conversion part 6 is formed in the concave part of the LED substrate 1 so as to seal in the periphery of the LED element 3. The configurations of other portions, including that of the wavelength conversion part 6, are similar with respect to the first embodiment, and therefore a description thereof has been omitted.

The light-emitting device 100 of the present embodiment can be produced by disposing the LED element 3 in the concave part of the LED substrate 1, adding the mixture of the phosphor, the organometallic compound, the layered silicate mineral, the inorganic particulate, the organic solvent, and water as used in the first embodiment, in a dropwise manner onto the concave part of the LED substrate 1 to fill same, and thereafter applying heat to form the wavelength conversion part 6.

In the light-emitting device 100 of the present embodiment, the phosphor is evenly dispersed within the wavelength conversion part 6 formed of the light-transmissive ceramic layer. For this reason, the heat resistance and/or light resistance of the wavelength conversion part 6 can be improved and the occurrence of color unevenness can be effectively reduced, similarly with respect to the first embodiment. The addition of the inorganic particulate also improves the film strength of the wavelength conversion part 6.

Because there is no need for the glass substrate 5 on which the wavelength conversion part 6 would be formed, the structure of the light-emitting device 100 is simpler and the number of components and/or the production steps can also be reduced, in comparison to the first embodiment. Also, not only the upper surface of the LED element 3 but also the side surface thereof is sealed in by the wavelength conversion part 6, and the light emitted from the side surface of the LED element 3 is also efficiently converted to fluorescent light. As a consequence thereof, the occurrence of color unevenness can be even more effectively suppressed.

The shape and/or size of the concave part of the LED substrate 1 can be designed as appropriate in accordance with the specifications for the light-emitting device 100. For example, a side surface of the concave part may be made into a tapered shape so as to be more readily filled with the precursor solution. An inner surface of the concave part may also be made to be a reflective surface, a configuration thereby being adopted for enhancing the light-emitting efficiency of the light-emitting device 100.

Moreover, the present invention is not limited to either of the embodiments described above, and a variety of modifications can be made within the scope indicated by the claims section. The technical scope of the present invention also includes embodiments obtained by combining, as appropriate, the respective technical means disclosed in each of the different embodiments. Although the descriptions in each of the embodiments above related to examples of light-emitting devices in which a blue LED and a phosphor are used concomitantly to emit white light, it shall be readily understood that the present invention can also be applied in a similar manner to a case where a green LED and/or a red LED is used concomitantly with a phosphor. Provided below is a more detailed description of the light-emitting device 100 of the present invention, using working examples and comparative examples.

—Examples for Preparing the Phosphor—

As a raw phosphor material, 7.41 g of $Y_2O_3$, 4.01 g of $Gd_2O_3$, 0.63 g of $CeO_2$, and 7.77 g of $Al_2O_3$ were thoroughly mixed together and an appropriate amount of ammonium fluoride was mixed thereinto as a flux. A crucible made of aluminum was filled with the resulting mixture, and was sintered for 2 to 5 hours in a temperature range of 1,350 to 1,450° C. in a reducing atmosphere through which a hydrogen-containing nitrogen gas was allowed to flow, thus yielding a sintered product (of $(Y_{0.72}Gd_{0.24})_3Al_5O_{12}:Ce_{0.04}$).

The resulting sintered product was ground, washed, separated, and dried, yielding a yellow-colored phosphor particulate having a mean particle diameter of about 10 μm. When the wavelength of light emitted under an excitation light having a wavelength of 465 nm was measured, there was a peak wavelength at a wavelength of about 570 nm.

—Preparing the Mixture—

WORKING EXAMPLE 1

0.02 g lipophilic, surface-treated smectite (Lucentite SPN, manufactured by Co-op Chemical) was mixed and dispersed into 1 g of a polysiloxane dispersion (14 wt % polysiloxane and 86 wt % isopropyl alcohol). 0.6 g of the phosphor prepared in the preparation example described above, 0.03 g silicon oxide particulate having a median diameter (D50) of 25 nm (NanoTek Powder, manufactured by CIK NanoTek), and 0.45 g pure water were mixed into this dispersion, thus preparing a mixture.

The mixed amounts of polysiloxane, smectite, phosphor, and silicon oxide particulate were determined such that the sum of the percentages by weight within the ceramic layer after heating and polymerization would reach 100 wt % (the same also applies to working examples 2 to 11 and comparative examples 1 to 7 described below).

WORKING EXAMPLE 2

A mixture was prepared by a method similar to that of working example 1, except in that the mixed amount of the phosphor was 1.1 g and the mixed amount of the pure water was 0.38 g.

WORKING EXAMPLE 3

0.01 g lipophilic, surface-treated smectite (Lucentite SPN, manufactured by Co-op Chemical) was mixed and dispersed into 1 g of a polysiloxane dispersion (14 wt % polysiloxane and 86 wt % isopropyl alcohol). 0.7 g of the phosphor prepared in the preparation example described above, 0.03 g of silicon oxide particulate having a particle size distribution of 1 to 24 μm and a median diameter (D50) of 3 μm (Hi-Silica F3, manufactured by Nitchitsu), and 0.07 g of pure water were mixed into this dispersion, thus preparing a mixture.

WORKING EXAMPLE 4

0.02 g of hydrophilic smectite not having been surface-treated (Lucentite SWN, manufactured by Co-op Chemical) and 0.26 g of pure water were mixed together to make a dispersion. 1 g of a polysiloxane dispersion (14 wt % polysiloxane and 86 wt % isopropyl alcohol), 1.1 g of the phosphor prepared in the preparation example described above, and 0.03 g silicon oxide particulate having a median diameter (D50) of 25 nm (NanoTek Powder, manufactured by CIK NanoTek) were mixed thereinto, thus preparing a mixture.

Working Example 5

A mixture was prepared by a method similar to that of working example 4, except in that the mixed amount of the pure water was 0.37 g and the mixed amount of the phosphor was 0.7 g.

WORKING EXAMPLE 6

A mixture was prepared by a method similar to that of working example 5, except in that the mixed amount of the phosphor was 0.5 g, and in that 0.17 g silicon oxide particulate having a median diameter (D50) of 3 μm (Hi-Silica F3, manufactured by Nitchitsu) was also mixed in.

WORKING EXAMPLE 7

A mixture was prepared by a method similar to that of working example 2, except in that the mixed amount of the phosphor was 1 g, and in that the mixed amount of silicon oxide particulate having a median diameter (D50) of 25 nm (NanoTek Powder; CIK NanoTek) was 0.1 g.

WORKING EXAMPLE 8

A mixture was prepared by a method similar to that of working example 2, except in that the mixed amount of the phosphor was 0.9 g, and in that the mixed amount of silicon oxide particulate having a median diameter (D50) of 25 nm (NanoTek Powder; CIK NanoTek) was 0.2 g.

WORKING EXAMPLE 9

A mixture was prepared by a method similar to that of working example 2, except in that the mixed amount of the phosphor was 0.33 g, and in that the mixed amount of silicon oxide particulate having a median diameter (D50) of 25 nm (NanoTek Powder; CIK NanoTek) was 0.75 g.

WORKING EXAMPLE 10

A mixture was prepared by a method similar to that of working example 4, except in that the mixed amount of the hydrophilic smectite was 0.05 g, the mixed amount of the pure water was 0.37 g, the mixed amount of the phosphor was 0.7 g, and the mixed amount of silicon oxide particulate having a median diameter (D50) of 25 nm (NanoTek Powder; CIK NanoTek) was 0.05 g.

WORKING EXAMPLE 11

A mixture was prepared by a method similar to that of working example 4, except in that the mixed amount of the hydrophilic smectite was 0.04 g, the mixed amount of the pure water was 0.3 g, the mixed amount of the phosphor was 0.2 g, and the mixed amount of silicon oxide particulate having a median diameter (D50) of 25 nm (NanoTek Powder; CIK NanoTek) was 0.2 g.

COMPARATIVE EXAMPLE 1

0.3 g of the phosphor prepared in the preparation example described above was mixed into 1 g of a polysiloxane dispersion (14 wt % polysiloxane and 86 wt % isopropyl alcohol), thus preparing a mixture.

COMPARATIVE EXAMPLE 2

0.02 g lipophilic smectite (Lucentite SPN; Co-op Chemical) was mixed and dispersed into 1 g of a polysiloxane dispersion (14 wt % polysiloxane and 86 wt % isopropyl alcohol). 1.1 g of the phosphor prepared in the preparation example described above was mixed into this dispersion, thus preparing a mixture.

COMPARATIVE EXAMPLE 3

A mixture was prepared by a method similar to that of comparative example 2, except in that the mixed amount of the lipophilic smectite was 0.1 g.

COMPARATIVE EXAMPLE 4

0.8 g of the phosphor prepared in the preparation example described above and 0.06 g silylated anhydrous silicic acid having a mean particle diameter of 7 nm (RX300, manufactured by Nippon Aerosil) were mixed into 1 g of polysilazane dispersion (20 wt % polysilazane and 80 wt % dibutyl ether— NL120—20 wt %, manufactured by AZ Electronic Materials), thus preparing a mixture.

COMPARATIVE EXAMPLE 5

A mixture was prepared by a method similar to that of comparative example 4, except that the mixed amount of the phosphor was 0.6 g and the mixed amount of the silylated anhydrous silicic acid having a mean particle diameter of 7 nm (RX300, manufactured by Nippon Aerosil) was 0.2 g.

COMPARATIVE EXAMPLE 6

A mixture was prepared by a method similar to that of comparative example 2, except that 0.38 g pure water was also mixed in.

COMPARATIVE EXAMPLE 7

A mixture was prepared by a method similar to that of comparative example 2, except in that 0.03 g silicon oxide particulate having a median diameter (D50) of 25 nm (NanoTek Powder, manufactured by CIK NanoTek) was also mixed in.

COMPARATIVE EXAMPLE 8

0.6 g of the phosphor prepared in the preparation example described above and 0.03 g silicon oxide particulate having a median diameter (D50) of 25 nm (NanoTek Powder, manufactured by CIK NanoTek) were mixed into 1 g of a polysiloxane dispersion (14 wt % polysiloxane and 86 wt % isopropyl alcohol), thus preparing a mixture.

Tables 1 to 3 illustrate the ingredient data for each of the working examples and comparative examples described above.

TABLE 1

| | Formulation ratios (wt %) | | | | | |
|---|---|---|---|---|---|---|
| Ingredient name | Working example 1 | Working example 2 | Working example 3 | Working example 4 | Working example 5 | Working example 6 |
| Phosphor | 82.5 | 89.6 | 85.7 | 89.6 | 84.6 | 62.7 |
| Polysiloxane | 10.6 | 6.3 | 9.4 | 6.3 | 9.3 | 9.7 |
| Polysilazane (NN120-20) | — | — | — | — | — | — |
| Hydrophilic smectite (SWN) | — | — | — | 1.6 | 2.4 | 2.5 |
| Lipophilic smectite (SPN) | 2.8 | 1.6 | 1.2 | — | — | — |
| Nano silica (NanoTek Powder) | 4.1 | 2.4 | — | 2.4 | 3.6 | 3.8 |
| Nano silica (RX300) | — | — | — | — | — | — |
| Hi-Silica (F3) | — | — | 3.7 | — | — | 21.3 |
| Total | 100 | 100 | 100 | 100 | 100 | 100 |
| Water (*) | 34.4 | 30.6 | 10.4 | 23.2 | 30.1 | 30.1 |

TABLE 2

| Ingredient name | Formulation ratios (wt %) | | | | |
| --- | --- | --- | --- | --- | --- |
| | Working example 7 | Working example 8 | Working example 9 | Working example 10 | Working example 11 |
| Phosphor | 83.5 | 75.2 | 28.0 | 79.8 | 38.7 |
| Polysiloxane | 6.4 | 6.4 | 6.5 | 8.8 | 14.9 |
| Polysilazane (NN120-20) | — | — | — | — | — |
| Hydrophilic smectite (SWN) | — | — | — | 5.7 | 7.7 |
| Lipophilic smectite (SPN) | 1.7 | 1.7 | 1.7 | — | — |
| Nano silica (NanoTek Powder) | 8.4 | 16.7 | 63.7 | 5.7 | 38.7 |
| Nano silica (RX300) | — | — | — | — | — |
| Hi-Silica (F3) | — | — | — | — | — |
| Total | 100 | 100 | 100 | 100 | 100 |
| Water (*) | 30.6 | 30.6 | 30.6 | 30.1 | 25.9 |

TABLE 3

| Ingredient name | Formulation ratios (wt %) | | | | | | | |
| --- | --- | --- | --- | --- | --- | --- | --- | --- |
| | Comparative example 1 | Comparative example 2 | Comparative example 3 | Comparative example 4 | Comparative example 5 | Comparative example 6 | Comparative example 7 | Comparative example 8 |
| Phosphor | 79.6 | 91.9 | 86.1 | 71.0 | 56.3 | 91.9 | 89.6 | 84.9 |
| Polysiloxane | 20.4 | 6.4 | 6.0 | — | — | 6.4 | 6.3 | 10.9 |
| Polysilazane (NN120-20) | — | — | — | 23.6 | 25.0 | — | — | — |
| Hydrophilic smectite (SWN) | — | — | — | — | — | — | — | — |
| Lipophilic smectite (SPN) | — | 1.7 | 7.8 | — | — | 1.7 | 1.6 | — |
| Nano silica (NanoTek Powder) | — | — | — | — | — | — | 2.4 | 4.2 |
| Nano silica (RX300) | — | — | — | 5.3 | 18.8 | — | — | — |
| Hi-Silica (F3) | — | — | — | — | — | — | — | — |
| Total | 100 | 100 | 100 | 100 | 100 | 100 | 100 | 100 |
| Water (*) | — | — | — | — | — | 30.6 | — | — |

(*) Ratio of water relative to the total amount of solvent (organic solvent plus water); i.e., a percentage of the total amount
-Manufacturing the wavelength conversion part and light-emitting device and assessing the performance thereof-

TESTING EXAMPLE 1

A vibrating viscometer (VM-10A-L, manufactured by CBC) was used to measure the viscosities of the mixtures prepared in working examples 1 to 11 and comparative examples 1 to 8. Glass substrates (50 mm×20 mm×t1 mm) were coated by a bar coating method with the mixtures from working examples 1, 3, 5, and 7 and comparative examples 3 and 8, such that the film thickness of the ceramic layer after sintering would be 40 μm, and heated for 1 hour at 500° C. to manufacture samples of the wavelength conversion part. In a similar manner, respective glass substrates having a thickness of 1 mm were each coated by a bar coating method with the mixtures from working examples 2 and 4 and comparative examples 2, 6, 7, and 8 such that the film thickness after sintering would be 35 μm, with the mixtures from working examples 8 and 10 and comparative example 1 such that the film thickness after sintering would be 45 μm, with the mixture from comparative example 4 such that the film thickness after sintering would be 50 μm, with the mixture from working example 6 such that the film thickness after sintering would be 55 μm, with the mixture from comparative example 5 such that the film thickness after sintering would be 60 μm, and with the mixture from working example 9 such that the film thickness after sintering would be 100 μm. The glass substrates were then heated for 1 hour at 500° C. to manufacture samples of the wavelength conversion part. For each one of the mixtures, 5 samples were manufactured.

Figure 3:
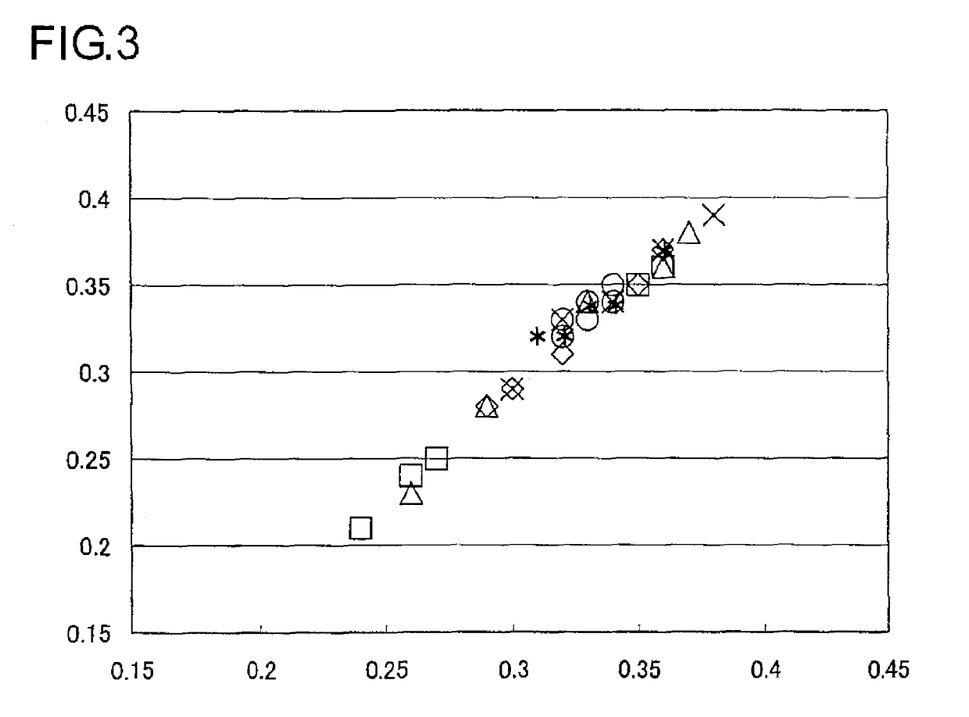
FIG. 3 is a graph illustrating the variance in chromaticity in working examples 1 to 6 and comparative examples 1, 2, 4, 7, and 8.

Among the resulting samples, a laser hologage (manufactured by Mitutoyo) was used to measure the film thickness for working examples 1 to 6 and for comparative examples 1, 2, 4, 7, and 8. Wavelength conversion parts were cut to about 1 mm², and light-emitting devices of the first embodiment where each of the wavelength conversion parts was mounted on a 1,000 μm×1,000 μm×100 μm blue LED in the manner of a flip-chip type were manufactured; a spectral radiance meter (CS-1000A, manufactured by Konica Minolta Sensing) was used to measure the chromaticity of the emitted light. Table 4 illustrates the results from the assessments of the film thicknesses and chromaticities, along with the viscosities of the precursor solutions (the mixtures). FIG. 3 illustrates the variance in chromaticity.

In Table 4, the following symbols are used in assessing film thickness, using as a reference value (100%) the film thickness of the first sample to be coated among the 5 samples: ⊚ for when the variance in film thickness among the 4 remaining samples is within the range ±10%; ○ for when the variance is within the range ±20%; Δ for when the variance is within the range ±30%; and × for when the variance in film thickness is greater than ±40%. In FIG. 3, the data series for working examples 1 to 6 is represented by ○; the data series for comparative example 1 is represented by □; the data series for comparative example 2 is represented by ×; the data series for comparative example 4 is represented by Δ; the data series for comparative example 7 is represented by ◇; and the data series for comparative example 8 is represented by *.

In the CIE-XYZ color system where the color space is represented by the XYZ coordinate system, chromaticity is defined as the point where a straight line passing through a certain point and the origin intersects with the plane x+y+z=1. The chromaticity is represented by the coordinates (x, y); the z coordinate, which is obtained on the basis of the relationship x+y+z=1, is omitted. The chromaticity of white-colored light is (0.33, 0.33), and the proximity of a chromaticity to this value corresponds to the proximity to being white-colored light. A lower value for the x coordinate corresponds to a stronger blue tinge to the white color, and a higher value for the x coordinate corresponds to a stronger yellow tinge to the white color. The 5 chromaticities in Table 4 are the chromaticities of each of the 5 coated samples; the value for each of the samples indicates the mean value of the chromaticities measured using 3 arbitrary samples from among the plurality of wavelength conversion parts cut out from the 50 mm×20 mm size.

TABLE 4

| | Viscosity (cP) | Film thickness | Chromaticity (x coordinate, y coordinate) |
|---|---|---|---|
| Working Example 1 | 56 | ⊚ | (0.32, 0.32) (0.33, 0.33) (0.32, 0.33) (0.33, 0.34) (0.34, 0.34) |
| Working Example 2 | 68 | ⊚ | (0.33, 0.34) (0.32, 0.33) (0.32, 0.32) (0.34, 0.34) (0.34, 0.35) |
| Working Example 3 | 32 | ⊚ | (0.34, 0.35) (0.34, 0.34) (0.33, 0.34) (0.32, 0.32) (0.34, 0.34) |
| Working Example 4 | 55 | ⊚ | (0.34, 0.34) (0.33, 0.34) (0.33, 0.33) (0.33, 0.34) (0.32, 0.33) |
| Working Example 5 | 78 | ⊚ | (0.33, 0.34) (0.34, 0.34) (0.34, 0.35) (0.32, 0.33) (0.33, 0.34) |
| Working Example 6 | 69 | ⊚ | (0.34, 0.34) (0.33, 0.34) (0.34, 0.35) (0.33, 0.33) (0.32, 0.32) |
| Comparative Example 1 | 4 | X | (0.24, 0.21) (0.26, 0.24) (0.27, 0.25) (0.36, 0.36) (0.35, 0.35) |
| Comparative Example 2 | 10 | Δ | (0.30, 0.29) (0.36, 0.37) (0.34, 0.34) (0.38, 0.39) (0.32, 0.33) |
| Comparative Example 4 | 7 | Δ | (0.29, 0.28) (0.33, 0.34) (0.37, 0.38) (0.36, 0.36) (0.26, 0.23) |
| Comparative Example 7 | 15 | X | (0.29, 0.28) (0.36, 0.37) (0.32, 0.31) (0.30, 0.29) (0.35, 0.35) |
| Comparative Example 8 | 12 | Δ | (0.31, 0.32) (0.33, 0.34) (0.32, 0.32) (0.34, 0.34) (0.36, 0.37) |

As is clear from Table 4 and from FIG. 3, the mixtures for the working examples 1 to 6, in which polysiloxane was mixed in as the organometallic compound and the phosphor, the smectite, the silicon oxide particulate and the pure water were added, had high viscosities, at 32 to 78 cP, and the variance in the film thicknesses of the wavelength conversion parts thus formed was within the range ±20%. The light-emitting devices in which the wavelength conversion parts were mounted on blue LEDs also had only slight variance in chromaticity. This is because the thickening effect imparted by the card-house structure adopted with the water being brought in between the layers of the smectite, as well as the thickening effect imparted by the silicon oxide particulate, enhanced the viscosity of the precursor solution and suppressed any settling of the phosphor.

By contrast, in comparative example 1, in which no smectite, silicon oxide particulate, or pure water was added to the mixture, in comparative example 2, in which no silicon oxide particulate or pure water was added, in comparative examples 4 and 8, in which no smectite or pure water was added, and in comparative example 7, in which no pure water was added, the viscosities of each of the respective mixtures was low, at 4 to 15 cP, and therefore the phosphor was prone to settling, and the variance in the film thicknesses of the wavelength conversion parts thus formed was greater than ±20%. Comparative examples 1, 2, 4, and 7 also had a high variance in the chromaticity of the light-emitting devices.

TESTING EXAMPLE 2

With respect to the samples of wavelength conversion parts manufactured in testing example 1, a 24 mm×15 mm adhesive tape (manufactured by Nichiban) was applied to the ceramic layers formed on the glass substrates in working examples 2 and 7 to 10, and in comparative examples 2, 3, and 5 to 8; the adhesive tape was then peeled off, whereupon the presence or absence of peeling of the ceramic layer was visually observed as an assessment of the film strength. Table 5 illustrates the results of the assessment of film strength, along with the inorganic particulate content of the ceramic layer, the ratio of water relative to the total amount of solvent (organic solvent plus water), and the viscosity of the mixture.

In the assessment of film strength in Table 5, ⊚ is used for when no film peeling occurred, ○ is used for when an amount of film in the range of no more than 10% of the surface area of the tape was peeled off; Δ is used for when an amount of film in the range of greater than 10% to at most 30% of the surface area of the tape was peeled off; and × is used for when an amount of film in the range greater than 30% of the surface area of the tape was peeled off.

TABLE 5

| | Inorganic particulate content (wt %) | Ratio of water relative to the solvent (wt %) | Viscosity (cP) | Film strength |
|---|---|---|---|---|
| Working example 2 | 2.4 | 30.6 | 68 | ⊚ |
| Working example 7 | 8.4 | 30.6 | 75 | ⊚ |
| Working example 8 | 16.7 | 30.6 | 89 | ⊚ |
| Working example 9 | 63.7 | 30.6 | 98 | ○ |
| Working example 10 | 5.7 | 30.1 | 211 | ⊚ |
| Comparative example 2 | — | — | 10 | X |
| Comparative example 3 | — | — | 16 | X |
| Comparative example 5 | 18.8 | — | 18 | X |
| Comparative example 6 | — | 30.6 | 20 | Δ |
| Comparative example 7 | 2.4 | — | 15 | ⊚ |
| Comparative example 8 | 4.2 | — | 12 | ⊚ |

As is clear from Table 5, in working examples 2 and 7 to 10, in which the polysiloxane was mixed in as the organometallic compound; and the phosphor, the smectite, the silicon oxide particulate, and the pure water were added, either no film peeling was noted or there was some film peeling but no more than 10% of the surface area of the tape, thus confirming that the film strength, too, was successfully ensured.

By contrast, in comparative examples 2 and 3, in which no silicon oxide particulate or pure water was added to the mixture, and comparative example 5, in which no layered silicate mineral or pure water was added, the viscosity of the mixture was low; i.e., 10 to 18 cP, and film peeling in the range greater than 30% of the surface area of the tape occurred. In comparative example 6, in which no silicon oxide particulate was added, the viscosity of the mixture was low, at 20 cP, and film peeling in the range greater than 10% of the surface area of the tape occurred. In comparative example 7, in which no pure water was added, no film peeling was observed and the film strength was successfully ensured, but the viscosity of the mixture was low; i.e., 15 cP, and therefore a problem was present in terms of the dispersibility of the phosphor within the ceramic layer after heating.

TESTING EXAMPLE 3

Figure 4:
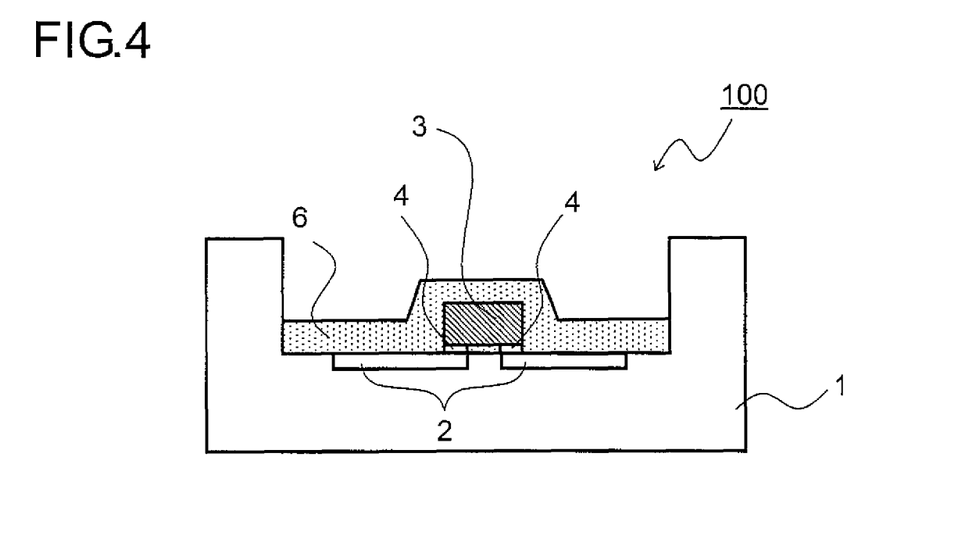
FIG. 4 is a schematic cross-sectional view of a light-emitting device according to a modification example of the second embodiment of the present invention, as manufactured in testing example 3.

The viscosity of the mixture prepared in working example 11 was 143 cP. This mixture was sprayed by a spray coating method onto the surface of the LED element 3 as well as onto the concave part of the LED substrate 1 into which the LED element 3 was built-in, as illustrated in FIG. 2. The LED substrate 1 was heated for 1 hour at 500° C., to form a ceramic layer (the wavelength conversion part 6) having a film thickness of 200 μm from the upper part of the LED element 3 and manufacture the light-emitting device 100. Five of these light-emitting devices were manufactured, and a spectral radiance meter (CS-1000A; Konica Minolta Sensing) was used to measure the chromaticity of the emitted light. Table 6 illustrates the results. In the present testing example, the manufacturing was performed by spraying, and therefore the LED element 3 was sealed in by the ceramic layer, as is illustrated in FIG. 4.

TABLE 6

|  | Chromaticity (x coordinate, y coordinate) |
|---|---|
| Working example 11 | (0.34, 0.35) (0.33, 0.33) (0.33, 0.34) (0.32, 0.32) (0.34, 0.34) |

As is clear from Table 6, there was only slight variance in the chromaticities of each of the light-emitting devices. This result confirms that even in a case where the wavelength conversion part was formed directly atop the LED element, suppressing effects against settling of the phosphor and against variance in chromaticity were obtained.

TESTING EXAMPLE 4

With respect to the wavelength conversion parts manufactured in testing example 1, a TSA-71S-A (manufactured by Espec) was used to carry out heat-shock testing by repeating 100 cycles on the samples from working example 2 and comparative examples 6 and 8, where one cycle is to keep the samples at −40° C. for 30 minutes and then keep the samples at 100° C. for 30 minutes.

The samples (the ceramic layers after sintering) were trimmed to a size of 5 mm×5 mm, and a 5-row×5-column grid of notches was cut into the surface of each of the samples. The size of each of the resulting sections was 1 mm×1mm. Thereafter, Nichiban tape was applied to the surface of each of the 25 resulting samples and then peeled off; the number of samples that peeled was measured as an assessment of layer strength. Table 1 illustrates the assessment results.

The references ⊚, ○, Δ, and × in Table 1 (*6) are as follows.
⊚=no peeling in any sample
○=peeling in 1 to 3 samples
Δ=peeling in 4 to 10 samples
×=peeling in 11 or more samples

TABLE 7

|  | Layer strength |
|---|---|
| Working example 2 | ⊚ |
| Comparative example 6 | Δ |
| Comparative example 8 | Δ |

As is clear from Table 7, in working example 2, in which the polysiloxane was mixed in as the organometallic compound; and the phosphor, the smectite, the silicon oxide particulate, and the pure water were added, no film peeling was noticed, thus confirming that the film strength, too, was successfully ensured.

By contrast, in comparative example 6, in which no silicon oxide particulate was added, and in comparative example 8, in which no layered silicate mineral was added, peeling occurred in 4 to 10 sheets.

INDUSTRIAL APPLICABILITY

The present invention, as has been described above, can be applied to a light-emitting device having a light-emitting element and a wavelength conversion part including a phosphor for converting the wavelength of the light emitted from the light-emitting element, and makes it possible to provide a light-emitting device having little variance in chromaticity and also having superior durability. As such, the present invention offers a light-emitting device that has higher performance, higher functionality, and lower costs.

LIST OF REFERENCE SIGNS

1 LED substrate
2 Metal part
3 LED element
4 Protruding electrode (bump)
5 Glass substrate
6 Wavelength conversion part

The invention claimed is:
1. A light-emitting device, comprising:
a light-emitting element for emitting light of a predetermined wavelength; and
a ceramic layer containing a phosphor, the phosphor being excited by light emitted from the light-emitting element and giving off fluorescent light of a wavelength different from an excitation wavelength,
the ceramic layer containing the phosphor, a hardened product of an organometallic compound, a layered silicate mineral, and an inorganic particulate,
the hardened product of the organometallic compound content of the ceramic layer being 2 to 50 wt %,
the layered silicate mineral content of the ceramic layer being 0.5 to 20 wt %,
the inorganic particulate content of the ceramic layer being 0.5 to 50 wt %,
a mean particle diameter of a primary particle diameter of the inorganic particulate being 0.001 to 20 μm, and
the phosphor being substantially evenly dispersed within the ceramic layer.
2. The light-emitting device according to claim 1, the layered silicate mineral content of the ceramic layer being 0.5 to 10 wt %.
3. The light-emitting device according to claim 1, the inorganic particulate content of the ceramic layer being 0.5 to 20 wt %.
4. The light-emitting device according to claim 1, the layered silicate mineral being a swellable clay mineral.
5. The light-emitting device according to claim 4, the swellable clay mineral having a smectite structure.
6. The light-emitting device according to claim 1, a mean particle diameter of the phosphor being 1 to 50 μm.
7. The light-emitting device according to claim 1, the organometallic compound being an organosiloxane compound.

8. The light-emitting device according to claim 1, the thickness of the ceramic layer being 5 to 500 μm.

9. The light-emitting device according to claim 1, the wavelength conversion part being formed atop a substrate comprising a transparent inorganic material, and the substrate having the wavelength conversion part being disposed on a light-emitting-surface-side of the light-emitting element.

10. The light-emitting device according to claim 1, the light-emitting element being sealed in using the ceramic layer.

11. The light-emitting device according to claim 1, the hardened product of the organometallic compound content of the ceramic layer being 2.5 to 30 wt %.

12. The light-emitting device according to claim 1, the phosphor content of the ceramic layer being 75.2 to 89.6 wt %.

\* \* \* \* \*